(12) United States Patent
Dietrich et al.

(10) Patent No.: US 11,626,144 B2
(45) Date of Patent: Apr. 11, 2023

(54) INTEGRATED MULTILEVEL MEMORY APPARATUS AND METHOD OF OPERATING SAME

(71) Applicants: Daryl G Dietrich, Woodland park, CO (US); Gary F Derbenwick, Colorado Springs, CO (US)

(72) Inventors: Daryl G Dietrich, Woodland park, CO (US); Gary F Derbenwick, Colorado Springs, CO (US)

(*) Notice: Subject to any disclaimer, the term of this patent is extended or adjusted under 35 U.S.C. 154(b) by 0 days.

(21) Appl. No.: 17/371,890

(22) Filed: Jul. 9, 2021

(65) Prior Publication Data
US 2023/0011673 A1  Jan. 12, 2023

(51) Int. Cl.
| | | |
|---|---|---|
| G11C 16/06 | (2006.01) | |
| G11C 7/06 | (2006.01) | |
| G11C 7/12 | (2006.01) | |
| G11C 7/10 | (2006.01) | |
| G11C 7/14 | (2006.01) | |

(52) U.S. Cl.
CPC .............. *G11C 7/06* (2013.01); *G11C 7/106* (2013.01); *G11C 7/1069* (2013.01); *G11C 7/1087* (2013.01); *G11C 7/1096* (2013.01); *G11C 7/12* (2013.01); *G11C 7/14* (2013.01)

(58) Field of Classification Search
CPC ........................................................ G11C 7/06
USPC ..................................................... 365/185.21
See application file for complete search history.

(56) References Cited

U.S. PATENT DOCUMENTS

| | | | |
|---|---|---|---|
| 2012/0134208 A1* | 5/2012 | Lee | G11C 16/0483 365/185.18 |
| 2016/0064054 A1* | 3/2016 | Chen | G11C 8/18 365/189.05 |
| 2018/0025766 A1* | 1/2018 | Dietrich | G11C 11/2255 365/65 |
| 2022/0068357 A1* | 3/2022 | Lin | G11C 5/06 |

* cited by examiner

*Primary Examiner* — Hoai V Ho
(74) *Attorney, Agent, or Firm* — Messner Reeves LLP; Scott J. Hawranek (57) ABSTRACT

The present invention includes apparatus and a method for reading one or more data states from an integrated circuitry memory cell, including the steps of connecting the memory cell to a bit line which is connected to an amplifier having an offset control which introduces an offset during the sensing portion of a read cycle to identify a data state stored in the memory cell.

13 Claims, 5 Drawing Sheets

INTEGRATED MULTILEVEL MEMORY APPARATUS AND METHOD OF OPERATING SAME

FIELD OF THE INVENTION

This invention relates to integrated circuits and methods of operation thereof, and more particularly, to integrated circuit memories that may store more than one bit per memory cell, but its scope applies to any memory cells and memories that may use features of this invention. An integrated circuit memory may be a semiconductor memory chip, an embedded memory array or a memory macro but also may be any latches that store data, among others.

BACKGROUND OF THE INVENTION

Integrated circuit memories are used to store information in many types of electronic devices. An integrated circuit memory array typically has a plurality of word lines running in one direction and a plurality of bit lines running orthogonal to the word lines, allowing each memory cell to be addressed by a specific word line and a specific bit line. Typically, in today's technology, a memory cell stores one bit per memory cell. However, versions of integrated circuit memories sometimes referred to as multilevel memories store more than one bit per memory cell, such as some types of NAND Flash memories.

Circuit boards used in electronic devices are often designed to operate at specified clock speeds. If a memory is designed to store more than one bit per memory cell and as a result the read cycle time increases so as to require a slower clock speed, its acceptance into the market may be impeded. So one challenge is to design a multilevel memory without compromising clock speed. This has been elusive for Dynamic Random Access Memory (DRAM) types. As DRAMs shrink in dimensions, memory cell sizes and memory cell capacitances may get smaller while bit lines may get longer causing read signal margins to decrease as the cell to bit line capacitance ratio decreases. With lower read signal margins, DRAMs that store one bit per memory cell become more difficult to accomplish and multilevel DRAMs become even more difficult to achieve.

DRAMs are referred to as volatile memories because they retain data only for short times even when continuously powered. Therefore, DRAMs need frequent data refreshing typically many times per second. However, because DRAMs are relatively inexpensive and have relatively high memory capacity, unlimited endurance and fast write times, they are used widely. Some devices that use DRAMs are cellular phones, servers, tablets, personal computers and smart TVs.

SUMMARY OF THE INVENTION

In light of the foregoing, it is an object of this invention to provide a new read method for reading two or more bits per memory cell. It is another object of this invention to use this new read method to read two or more bits per memory cell without unacceptably increasing the read cycle time so that decreases in clock frequency are not necessary. It is another object of this invention to use this new read method to provide a reliable reference scheme for a multilevel DRAM configuration. It is another object of this invention to provide a new read method without increasing the power requirements per bit for the read cycle. It is a further object of this invention to provide a multilevel memory circuit methodology that may be applicable to other integrated circuit memory types.

In a one bit memory cell, one of two voltage or charge levels is stored in the memory cell. These two levels correspond to a logical one or a logical zero. For a two bit memory cell, one of four different voltage or charge levels is stored in the memory cell. These four levels correspond to data bits of (0,0), (0,1), (1,0) and (1,1), where the first number in parenthesis will be defined as the first bit and the second number in parenthesis will be defined as the second bit. The levels stored in a memory cell are referred to as data states. The preferred embodiment of this invention uses a new read method that introduces an intentional offset in an amplifier to sense data states stored in a memory cell.

The new read method is initiated by precharging addressed bit lines and their corresponding reference bit ones. Amplifiers connected to each of the addressed bit lines are powered and their inherent offsets are nulled. The addressed memory cells are connected to their respective bit lines by activating the addressed word line. Voltage levels corresponding to data states stored in the addressed memory cells are identified and sensed by the amplifiers. A first bit is identified for each bit line and stored in a data latch. For each bit line, an offset that depends on the first bit read is introduced into its connected amplifier. Adjusting the offset allows the voltage levels corresponding to data states stored in the addressed memory cell to be further identified without changing the differential voltage between the addressed bit line and the reference bit line. The second bit stored in each memory cell is identified and stored in a second data latch. Because sensing voltage levels stored in a DRAM destroys data, the previously stored voltage levels for each addressed memory cell are rewritten back into the memory cells.

For a given technology node or design rule, the combined effect of the improvements of this invention can result in memory arrays that double the capacity of a semiconductor memory without significantly increasing its physical chip size or cost. This can result in a reduction in cost per bit up to a factor of two. Furthermore, these improvements can increase the memory capacity in an electronic device without increasing circuit board space.

It can be appreciated that the methods of the current invention can also be used by extension to provide more than two bits per memory cell. For example, detection of three bits per memory cell might require sensing eight different data states that may be stored in a memory cell. This might require the offset of the amplifier to be adjusted multiple times provided there is adequate signal margin to do so.

This invention provides a new read method and corresponding integrated circuit means for storing and reading two or more bits per memory cell. In the case of a destructive read architecture, this invention also includes a circuit means for rewriting or refreshing the bits back into the memory cell. These and other objects, features and advantages are provided according to this invention for integrated circuit memory devices and methods in which higher data capacity, lower cost per bit semiconductor memories can be manufactured.

DETAILED DESCRIPTION OF PREFERRED FORM OF THE INVENTION

The preferred embodiment of this invention relates to a DRAM storing two bits per memory cell. The read cycle consists of five steps. The first step is precharging selected bit lines to a predetermined voltage. The second step is powering amplifiers connected to the bit lines and nulling the inherent offsets of the amplifiers. The third step is turning on the addressed word line, identifying voltages levels corresponding to data states stored in the memory cells and latching the first bit in a data latch. The fourth step is introducing an offset into each amplifier that depends on the first bit read by that amplifier without changing the voltage differential between the addressed bit line and the reference bit line. This allows identifying the second bit that is then latched in a second data latch. The third and fourth steps of the read cycle comprise the sensing portion of the read cycle. The sensing portion of the read cycle does not include the nulling portion of the read cycle. The fifth step is rewriting the data state back into the memory cell.

Any practical amplifier has an offset voltage caused primarily by manufacturing process variations. The output offset voltage of a differential amplifier is defined as the output voltage when both inputs to the amplifier are at zero volts or at the same voltage. The input offset voltage is defined as the voltage difference required on the amplifier inputs to drive the output voltage to zero. The output and input offset voltages are not independent. The input offset voltage is the output offset voltage divided by the gain of the amplifier. Hence, one can simply refer to the offset voltage or offset of an amplifier without necessarily specifying input or output offset voltage. All amplifiers are fundamentally differential amplifiers. In the case of so-called single-ended amplifiers, the second input is usually ground potential.

Because the preferred embodiment of this invention allows fast sensing of a data state stored in a memory cell, the bits can be identified sequentially, Performing an amplifier offset nulling operation before identifying the first bit allows for fast latching of the first bit. Introducing an offset into the amplifier allows for fast latching of the second bit. Fast reading of both bits compensates for some of the time it takes for the nulling portion of the read cycle, which should be made as short as possible for best read access time. The rewriting portion of the read cycle should also be made as short as possible to allow subsequent reading of other bits in the same memory array segment.

For two bits per memory cell, one of four data states is stored in the memory cell. Corresponding to these four data states are four voltage or charge levels that can be stored on the memory cell capacitor. Because of charge sharing that occurs between a memory cell capacitor and bit line capacitance when a memory cell is accessed, one of four smaller voltage levels corresponding to the level stored on the memory cell capacitor is generated on the bit line during the sensing portion of a read cycle. The preferred embodiment has two of these levels positive with respect to the voltage generated on the addressed bit line after the nulling portion of the read cycle and the other two levels negative with respect to that voltage on the addressed bit line. For the four data states, the two bits stored in the memory cell will be defined as (1,1) for strong positive voltage, (1,0) for weak positive voltage, (0,1) for weak negative voltage, and (0,0) for strong negative voltage.

Figure 1:
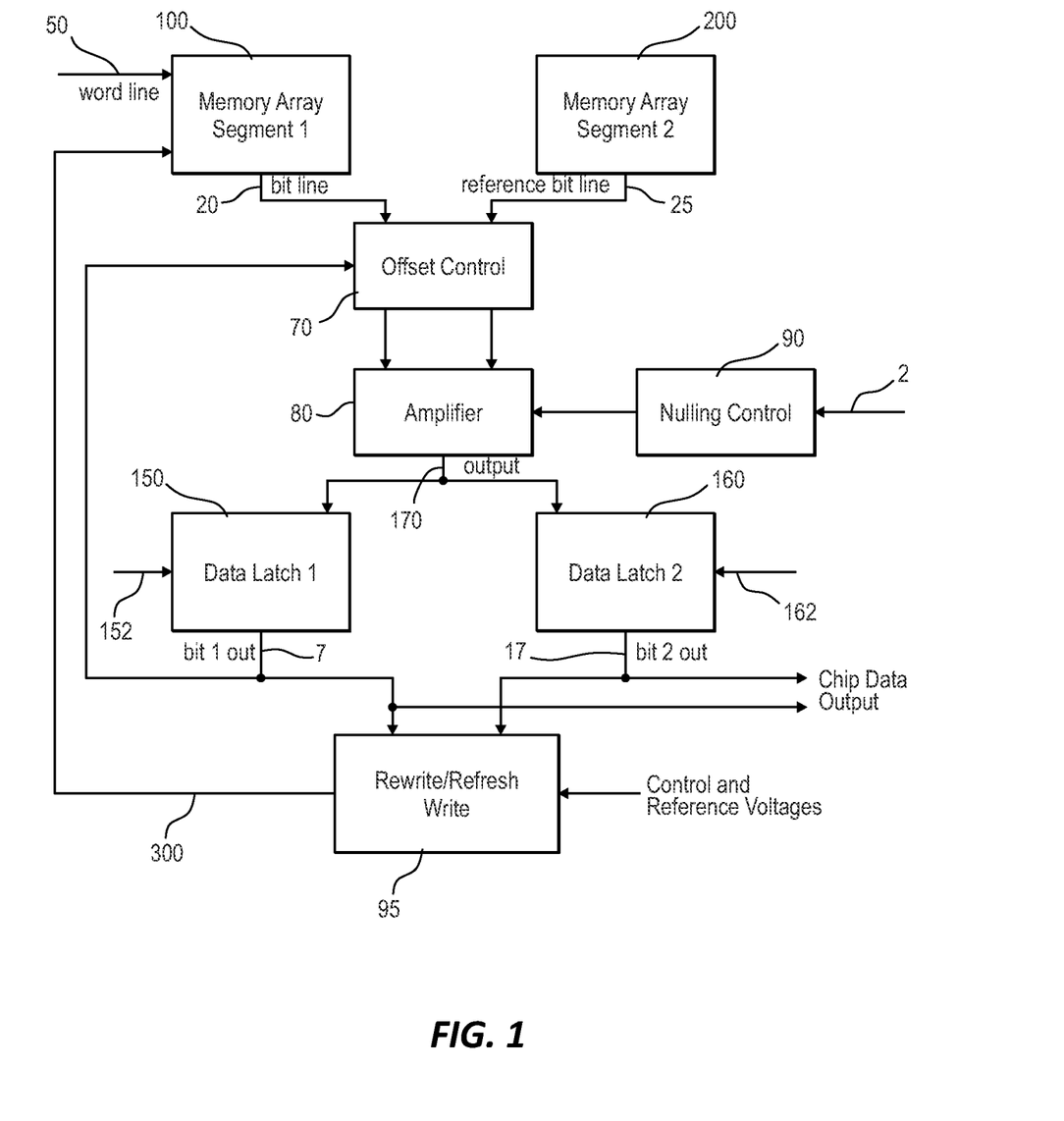
FIG. 1 is a block diagram of the preferred embodiment of the integrated multilevel memory system of this invention.

FIG. 1 shows a block diagram of this invention for the preferred embodiment. In practice, when a single word line is activated in a typical semiconductor memory, multiple memory cells along the word line are read using multiple amplifiers connected to the bit lines. However, FIG. 1 illustrates the reading of bits from only one of these memory cells along the word line, it being understood that multiple memory cells will ordinarily be read.

Addressed memory cell 10 is in a first memory array segment 100 and is accessed by word line 50 and bit line 20. Reference bit line 25 is in a second memory array segment 200 that has no word lines turned on. A sense amplifier comprises amplifier 80 and offset control 70 to which bit lines 20 and 25 are connected. Nulling control 90 is connected to bit lines 20 and 25. Nulling control signal 2 is applied to nulling control 90 prior to activating word line 50. A first data latch 150 and a second data latch 160 are connected in parallel to output 170 of amplifier 80. During the sensing portion of the read cycle, latch 150 stores the first bit when signal 152 is applied to it. Output 7 of data latch 150 is fed back into offset control 70 to introduce an offset in the sense amplifier for identifying the second bit stored in memory cell 10. Data latch 160 stores the second bit when signal 162 is applied to it. At the conclusion of the sensing portion of the read cycle, the bits are rewritten into memory cell 10 by rewrite element 95. Precharge circuitry which is known to one skilled in the art is not shown in FIG. 1.

Figure 2:
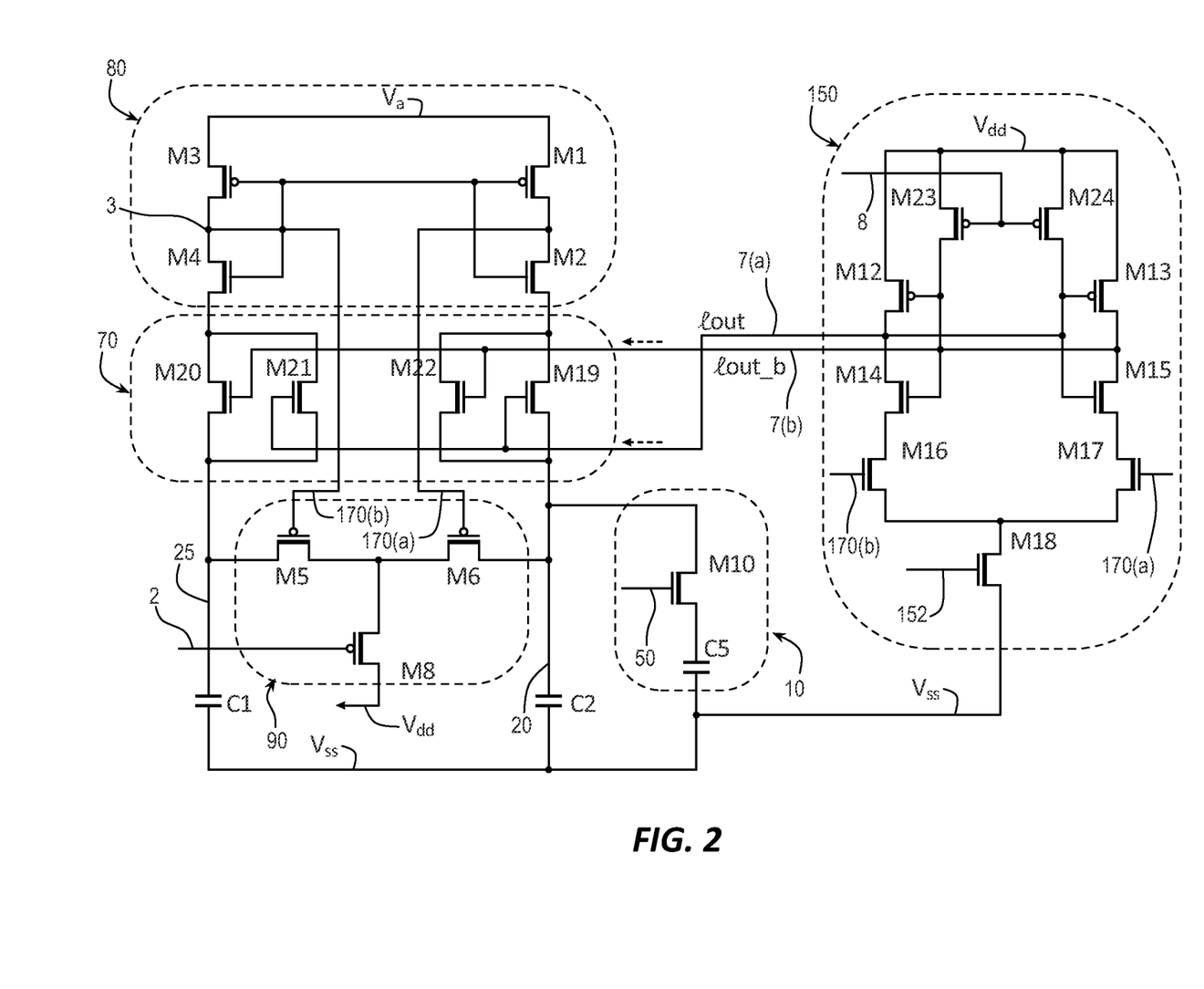
FIG. 2 is a schematic diagram corresponding to block elements of the memory system illustrated in FIG. 1.

FIG. 2 shows transistor level circuit schematics corresponding to specific circuit blocks of FIG. 1. Where both true and inverted versions of a signal are used, these are designated by appending to the element number "(a)" for the true version and appending "(b)" for the inverted version. True and inverted versions of a signal are not shown in FIG. 1.

FIG. 2 shows memory cell 10 comprising word line transistor M10 connected to memory cell storage capacitor C5. Amplifier 80 comprises transistors M1, M2, M3 and M4 and offset control 70 comprises transistors M19, M20, M21 and M22. Amplifier 80 and offset control 70 comprise the sense amplifier. Bit line 20 is connected to transistors M19 and M22 in the sense amplifier and bit line 25 is connected to transistors M20 and M21 in the sense amplifier. The capacitance of bit line 20 is C2 and the capacitance of reference bit line 25 is C1. Nulling control 90 consists of transistors M5, M6 and M8.

For the preferred embodiment of this invention, amplifier 80 is a double current mirror amplifier in part because it has high gain. Its gain can be set in the range from below 50 to 200 or higher, for example, with the gain set for the parameters of the specific memory circuit design. High gain allows better nulling of the offset of the amplifier and facilitates sensing of small bit line signals that can allow longer bit lines to be used. The choice of amplifier 80 also provides the benefit of continuous connection of bit lines 20 and 25 to the sense amplifier during the nulling and sensing portions of the read cycle.

The voltage powering the sense amplifier comprising amplifier 80 and offset control 70 is not between power supply Vdd and ground potential Vss, but rather between voltage Va and the voltages that are generated on bit lines 20 and 25. As the voltages on bit lines 20 and 25 are set by precharging and then further increased through amplifier 80 during the nulling and sensing portions of the read cycle, the voltage powering amplifier 80 decreases proportionately. For faster operation it may be necessary to increase Va above power supply voltage Vdd to compensate for the rise in the voltages on bit lines 20 and 25 during the read cycle. The transistor configuration of amplifier 80, offset control 70 and nulling control 90 allows for a small increase in Va without forward biasing junctions or causing electrical breakdown of transistors or junctions. Amplifier 80 is configured so that output 170(b) remains at approximately half of amplifier supply voltage Va by connecting the gates of transistors M3 and M4 to source/drain node 3 between transistors M3 and M4. Therefore, the signals on nodes 170(a) and 170(b) are not true inversions of each other.

For the preferred embodiment, the sense amplifier drives currents onto bit lines 20 and 25 during the nulling and sensing portions of the read cycle. This is in contrast to conventional sense amplifiers where bit lines are connected only to gates in a sense amplifier so that the bit lines float during the sensing portion of the read cycle. Alternatively, it can be appreciated that other amplifiers that have offset control can be used for this invention. It may not be necessary to have nulling control connected to the sense amplifier if the inherent offset of the sense amplifier can be tolerated, although nulling or partially nulling the output offset voltage of an amplifier can provide the ability to reliably sense smaller signals on bit lines.

FIG. 2 shows a transistor level schematic for data latch 150 for the preferred embodiment. True output 7(a) and inverted output 7(b) are fed back into offset control 70. Circuitry for data latch 160 is not shown in FIG. 2 because it is identical to that shown for data latch 150 except that outputs for data latch 160 are not fed back into offset control 70. Outputs of amplifier 80 are connected only to gates of transistors M16 and M17 in latch 150 and the corresponding transistor gates in data latch 160 allowing outputs 170(a) and 170(b) of amplifier 80 to be continuously connected in parallel to the inputs of both data latches 150 and 160. Prior to being powered for latching bits, data latches 150 and 160 are connected to Vdd and control signals 152 and 162 are not powered. Data latch 150 is powered by turning on transistor M18 using control signal 152 to connect data latch 150 to Vss, Data latch 160 is powered in a similar manner using control signal 162 (see FIG. 1). Data latches 150 and 160 each store data only when each is powered.

As a matter of good practice, prior to commencement of the nulling portion of the read cycle and around the same time that bit lines 20 and 25 are precharged, output nodes 7(a) and 7(b) of data latch 150 are precharged to Vdd to eliminate any residual charge that might be on these nodes from a previous cycle. This is accomplished by holding node 8 at Vss so that transistors M23 and M24 are on. For the duration of the read cycle, node 8 is raised to Vdd to turn off transistors M23 and M24. The corresponding output nodes 17(a) and 17(b) (not shown in FIG. 2 but identified in FIGS. 4 and 5) of data latch 160 are similarly precharged to Vdd.

The first step of a read cycle is precharging bit lines 20 and 25 to a predetermined voltage. The precharge voltage depends on the specific design because at the conclusion of the nulling portion of the read cycle the voltage on bit line 20 should have charged to a voltage between the voltage developed on bit line 20 for the two more negative levels stored on memory cell capacitor C5 and the two more positive levels stored on memory cell capacitor C5. For Vdd of 1.5V, the precharge voltage may be of the order of 0.35V.

The second step of the read cycle is powering the sense amplifier comprising amplifier 80 and offset control 70 and nulling its offset to the degree desired. After precharging bit lines 20 and 25, the sense amplifier is powered by connecting it to Va. Vs is preferably above Vdd by approximately the same amount that bit lines 20 and 25 charge to at the conclusion of the nulling portion of the read cycle. When amplifier 80 is powered, transistors M1 and M2 provide a small current into bit line 20 and transistors M3 and M4 provide a similar current into reference bit line 25 causing the voltages on bit lines 20 and 25 to slowly increase.

The nulling portion of the read cycle is commenced by applying nulling control signal 2 to nulling control 90, When transistor M8 is activated by nulling control signal 2, additional unequal small currents are supplied to bit lines 20 and 25 through transistors M6 and M5, respectively. These additional currents tend to become equal when the output of amplifier 80 approaches null, creating a differential voltage between bit lines 20 and 25 at the input to the sense amplifier that nulls the output of amplifier 80. While the offset of each sense amplifier will vary across the many sense amplifiers on a chip, each sense amplifier will null itself independently.

Depending on the specific design, the inherent output offset voltage of each sense amplifier need not be nulled all the way to zero during the nulling portion of the read cycle depending on the sensing margin of the four data states that can be stored in memory cell 10 and the corresponding voltages that develop on bit line 20. Once sufficient nulling has occurred transistor M8 is turned off.

The nulling speed is identified in part by the sizes of transistors M5, M6 and M8, Nulling control 90 and the sense amplifier comprising amplifier 80 and offset control 70 must be designed so that adequate nulling is obtained in the shortest time possible taking into account the maximum inherent offset of each sense amplifier that might be encountered for a given manufacturing process and avoiding unnecessary overshoot of each sense amplifier output beyond its nulled state. P-channel rather than n-channel transistors are used in the preferred embodiment for transistors M5, M6 and M8 to obtain a better nulling response and to better control overshoot of the offset null. P-channel transistors can provide a faster increase in bit line voltage during the nulling portion of the read cycle than if n-channel transistors were used.

The voltage on bit line 20 at the conclusion of the nulling portion of the read cycle is higher than that for strong and weak negative voltages but less than that for weak and strong positive voltages. For prior art DRAMs storing one bit per memory cell, the data state that was stored in a memory cell is identified by comparing the voltage generated on the addressed bit line relative to that on a reference bit line. However, for this invention, the two more positive data states are distinguished from the two more negative data states that were stored in the memory cell by whether the voltage on bit line 20 increases or decreases when word line transistor M10 is turned on, irrespective of the voltage on reference bit fine 25 after completion of the nulling cycle.

The third step of the read cycle identifies and latches the first bit corresponding to the data state stored in memory cell 10. Word line 50 is activated turning on word line transistor M10. Charge shares or equilibrates between memory cell capacitor C5 and bit line capacitance C2 causing the voltage on bit line 20 to change. With a bit line to cell capacitance ratio of 40:1, for example, the voltage change resulting on bit line 20 is approximately 1/40 of the voltage change on C5 times the difference in voltage between that stored on capacitor C5 and the voltage on bit line 20. Assume bit line 20 has charged to 400 mV at the conclusion of the nulling portion of the read cycle and a strong positive voltage of 1.1V was stored on memory cell capacitor C5. Bit line 20 will charge to approximately 400 mV plus 1/40 times 700 mV or 417, 5 mV. Similar analysis can be done for the other three voltages that could be stored in memory cell 10. In each case, the change in voltage on bit fine 20 when word line 50 is activated provides a sufficient signal for amplifier 80 to correctly determine the data state that was stored in memory cell 10.

The first bit is identified by whether the voltage on bit line 20 goes more positive or goes more negative when word line transistor M10 is turned on. More positive corresponds to a logical one and more negative corresponds to a logical zero for the first bit, so for data states (1,1) and (1,0) bit line 20 will charge positively and for data states (0,1) and (0,0), bit line 20 will charge negatively. Because of the prior nulling cycle of the sense amplifier, it only takes a small change in voltage on bit line 20 to generate a signal on output 170(a) of amplifier 80. Data latch 150 is powered by applying voltage to control signal 152 to turn on transistor M18 at a predetermined time after the nulling part of the read cycle is completed. Once data latch 150 is powered and latches the first bit, the data stored in data latch 150 will not change if amplifier 80 outputs 170(a) and 170(b) change when identifying the second bit because data latch 150 remains powered.

To provide for the best signal margin, care should be exercised in the memory array architecture to minimize adverse effects caused by capacitive coupling between adjacent bit lines in both memory array segments 100 and 200, as is known to one skilled in the art, During the sensing portion of the read cycle small differential signals are sensed between bit lines 20 and 25. Therefore, it is important that noise and any fluctuations in the power supply voltages generated by other circuitry on the chip be kept to a minimum during the sensing portion of the read cycle.

The fourth step of the read cycle identifies and latches the second bit. This requires determination of whether the stored voltage was strong or weak, and therefore whether the second bit is a one or zero, respectively. Rather than changing the voltage on reference bit line 25 for the second part of the sensing portion of the read cycle which would take more time, the offset of the sense amplifier is automatically adjusted by outputs 7(a) and 7(b) of data latch 150 applied to offset control 70 instead. The offset of the sense amplifier is adjusted by an amount that allows determination if the voltage level that was stored in memory cell capacitor C5 was strong or weak.

Transistors M19 and M22 in offset control 70 insert a small resistance between bit line 20 and transistor M2 in amplifier 80. Likewise, transistors M20 and M21 insert a small resistance between reference bit line 25 and transistor M4 in amplifier 80. Imbalance in transistors M19 and M22 relative to the imbalance in transistors M20 and M21 is nulled out during the nulling portion of the read cycle because these transistors are on. As the first bit stored in memory cell 10 is latched in data latch 150, outputs 7(a) and 7(b) of data latch 150 turn off transistor pair M19 and M21 or transistor pair M20 and M22 depending on whether the first bit read was a zero or one, respectively. This changes and imbalances the small resistances in offset control 70 between bit lines 20 and 25 and amplifier 80. Because the currents through transistors M3 and M4 and through transistors M1 and M2 in amplifier 80 are constant, the imbalance in these small resistances causes the differential input voltage to amplifier 80 to change. This causes a corresponding change in the output voltage of amplifier 80 knocking the sense amplifier off of its null point even though the differential voltage between bit lines 20 and 25 doesn't change.

Depending on whether transistor pair M19 and M21 or transistor pair M20 and M22 were turned off when data latch 150 was powered, the direction of the offset to be introduced into the sense amplifier changes its output either positively or negatively, respectively, in order to determine the second bit. The drives of M19, M20, M21 and M22 can be designed so that the offset adjustments in the positive and negative directions do not have to be the same. The drives of transistors M19 and M20 are stronger than those for transistors M21 and M22. For example, the width to length ratio of the stronger transistors might be typically up to 2 times or more that of the weaker transistors. These ratios are set by the design of a sense amplifier and how far its offset has to be adjusted to determine the second bit.

Once an offset is introduced into the sense amplifier using offset control 70, the output state of amplifier 80 stays the same or changes depending on whether the data state that was stored in memory cell 10 was a strong or weak voltage, respectively. This preferably occurs asynchronously after data latch 150 latches its data. Data latch 160 can then be powered shortly after powering data latch 150, providing for fast identification of the second bit stored in memory cell 10. After the second bit is stored in data latch 160, the sensing portion of the read cycle ends and the bits are available to be routed to the output pins of the memory chip.

When identifying whether the data state that was stored in memory cell 10 was a strong or weak voltage by turning off either transistors M19 and M21 or transistors M20 and M22, variations in these transistors across a chip can cause slight differences in adjusting the offset of each sense amplifier across the chip. This effect needs to be taken into account for a given manufacturing process and design. Therefore, transistors M19, M20, M21 and M22 should be laid out carefully to minimize mismatches in these transistors caused by process variations and other effects in order to get the best read margin for the fourth step of the read cycle.

Figure 3:
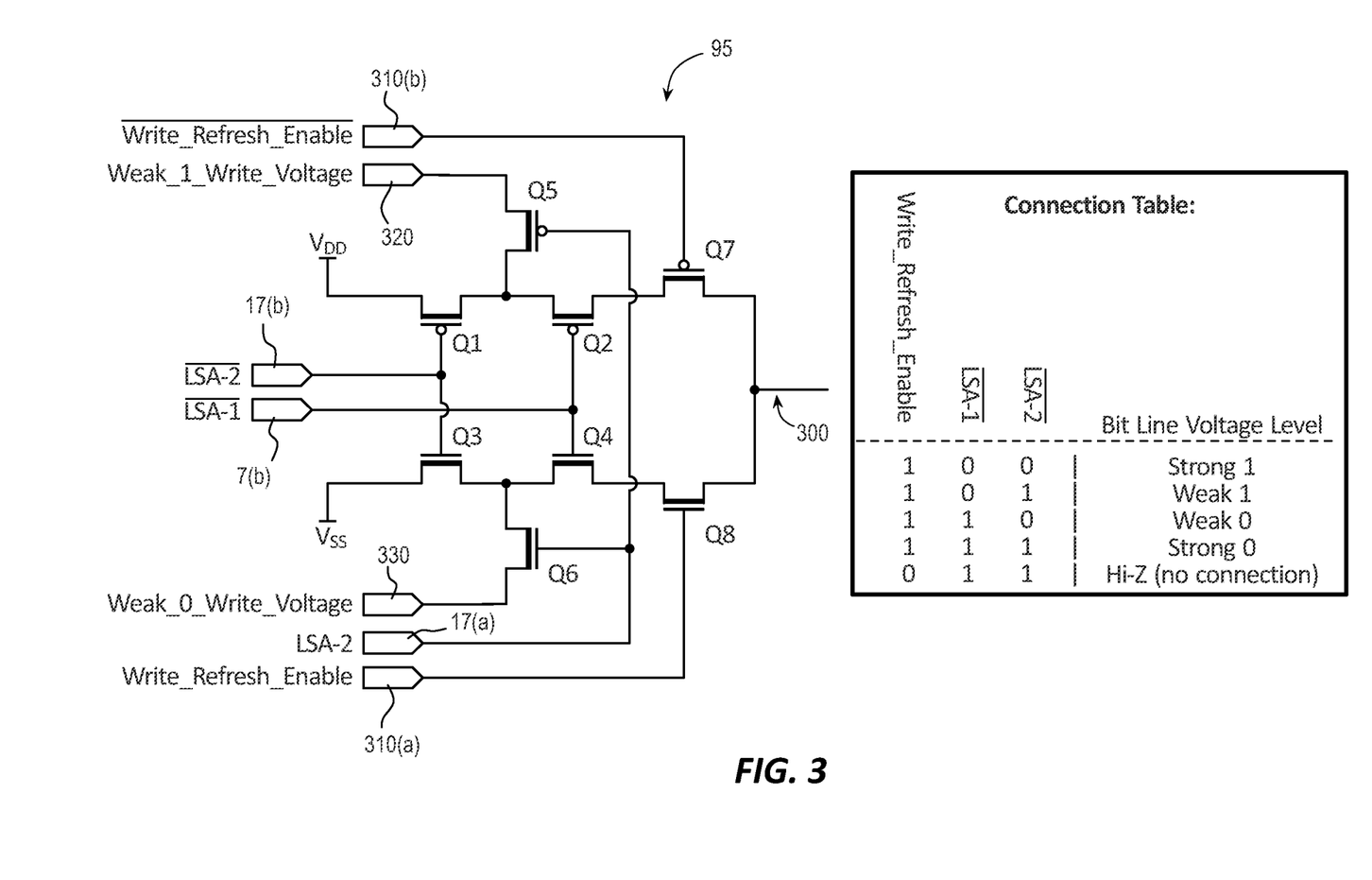
FIG. 3 is a schematic diagram of a rewrite apparatus and its associated connection table for rewriting bits into a memory cell following the sensing portion of a read cycle.

For a destructive read memory such as a DRAM, the fifth step of the read cycle is to rewrite the data state back into memory cell 10 preferably at the same time the data in data latches 150 and 160 are routed to the output of the memory chip. FIG. 3 shows an example of rewrite apparatus 95 and the corresponding connection table that can be used for rewriting one of the four data states or voltages back into memory cell 10. The proper voltage is rewritten onto memory cell capacitor C5 by using the bits stored in data latches 150 and 160.

The rewrite apparatus of FIG. 3 provides a strong positive voltage that is one n-channel threshold voltage below Vdd. A strong negative voltage of Vss is provided. For the other two memory states, a weak positive voltage is supplied to node 320 and a weak negative voltage is supplied to node 330. Transistors Q1 through Q8 are configured to provide the logic function to apply the proper voltage at node 300, the output of this rewrite apparatus. The voltage on node 300 is gated onto bit line 20 through bit line select circuitry not shown, but familiar to one skilled in the art.

An enable signal and its inverse are applied to nodes 310(a) and 310(b), respectively, to activate output 300 for the rewrite operation. Node 310(a) goes from Vss to Vdd at which time transistors Q7 and Q8 are turned on to allow the proper voltage to be routed to bit line 20. The inverted output node 7(b) of data latch 150 and the true and inverted outputs 17(a) and 17(b), respectively, of data latch 160 are used to control the logic function of the circuitry.

For one skilled in the art, circuitry for rewriting the data in a memory cell at the end of the read cycle is relatively straight forward. Alternative circuitry to that shown in FIG. 3 might be chosen.

If new data are to be loaded into memory cell 10 instead of rewriting data previously stored in memory cell 10, the new data are loaded into data latches 150 and 160 in a manner similar to that in conventional DRAMs that store one bit per memory cell. Once data latches 150 and 160 contain the new data, circuitry like that shown in FIG. 3 is used to apply the correct voltage of the four voltage levels to bit line 20 for the write operation. Circuitry for loading new data into data latches is known to one skilled in the art.

One skilled in the art will recognize that the schematic diagram shown in FIG. 2 for data latch 150 is similar to that typically used for a sense amplifier in a conventional integrated circuit memory. For this invention, the sense amplifier comprising amplifier 80 and offset control 70 might then be interpreted as a preamplifier connected to more conventional sense amplifiers. Additionally, nulling control 90 might be considered a component of the sense amplifier. These alternative embodiments do not change the circuit operation and do not change the basic principles of this invention. Furthermore, FIG. 2 shows amplifier 80 and data latch 150 as separate circuitry. Data latch 150 might be integrated with amplifier 80 so that some transistors are shared as one skilled in the art can appreciate, but this also does not change the basic principles of this invention.

For the preferred embodiment, offset control 70 and amplifier 80 comprise the sense amplifier. An alternative embodiment is that amplifier 80 is the sense amplifier and offset control 70 is circuitry placed between the bit lines and the sense amplifier. For this embodiment, for identifying the second bit corresponding to a data state stored in memory cell 10, the offset of amplifier 80 is not changed but instead the signal input to amplifier 80 is modified by offset control 70 in order to introduce an offset in the output of amplifier 80. This alternative embodiment does not change the basic principles of this invention.

A specific design must take into account retention effects of the charge stored on memory cell capacitors. Typical refresh times for today's DRAMs can be about 64 ms. Data failures are typically not seen until the refresh times are slowed to the order of 256 ms. Therefore, some decay of the charge stored on a memory cell capacitor occurs before the data are refreshed. This means that the voltage or charge stored on a memory cell capacitor can vary at the commencement of a read cycle depending on the amount of time from the previous read, write or refresh cycle until sensing the data in the memory cell. The selection of the four voltage levels to be stored on a memory cell capacitor for a specific design and technology is therefore identified by the amount of charge equilibration that is required for adequate signal margin as well as variations in the amount of charge on the memory cell capacitor at the commencement of the read cycle due to retention effects. It may be necessary to refresh the memory more frequently if retention effects cause read signal margins to decrease unacceptably.

Figure 4:
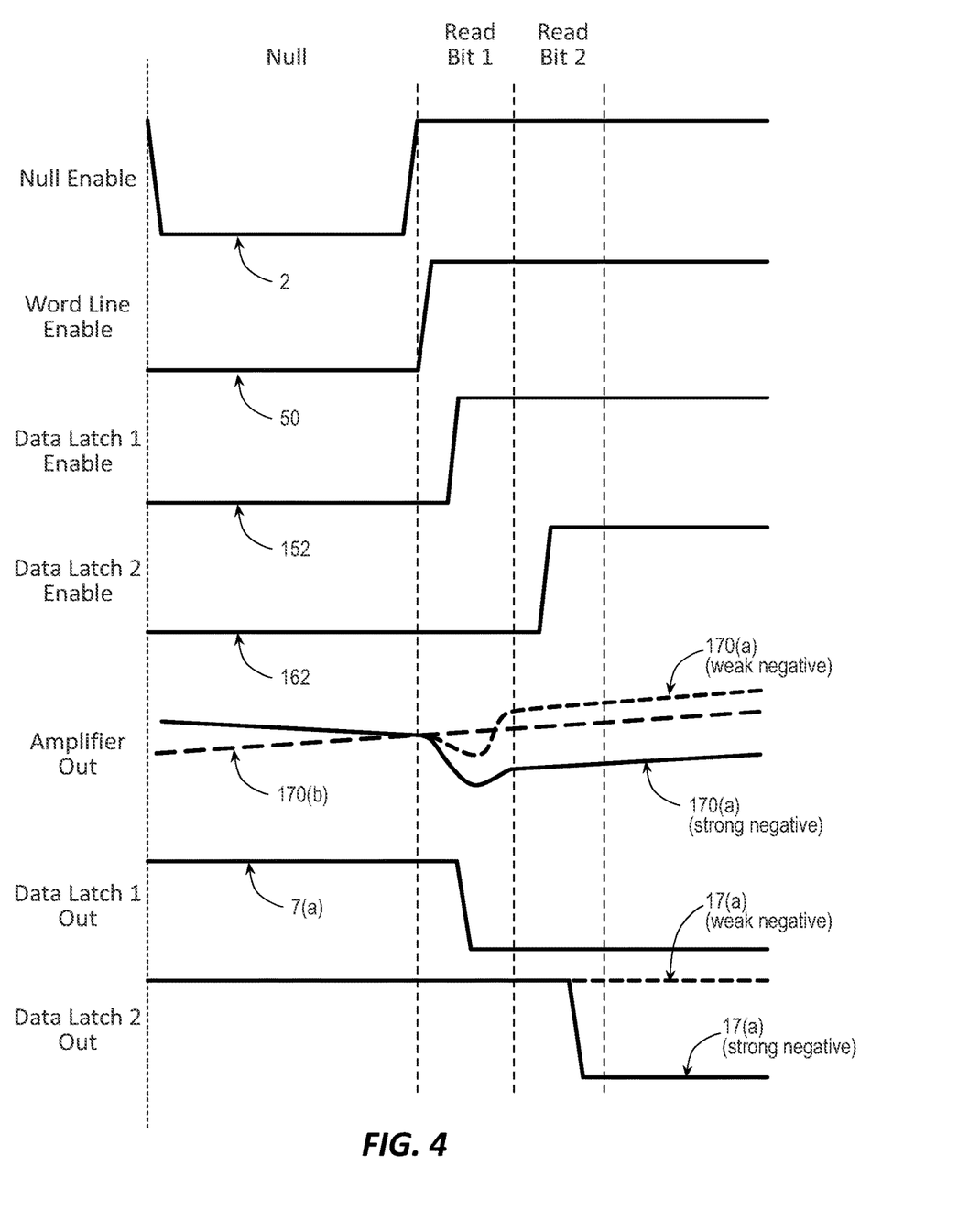
FIG. 4 is a timing diagram showing sensing of (0,0) and (0,1) data states based on simulations for the preferred embodiment.
Figure 5:
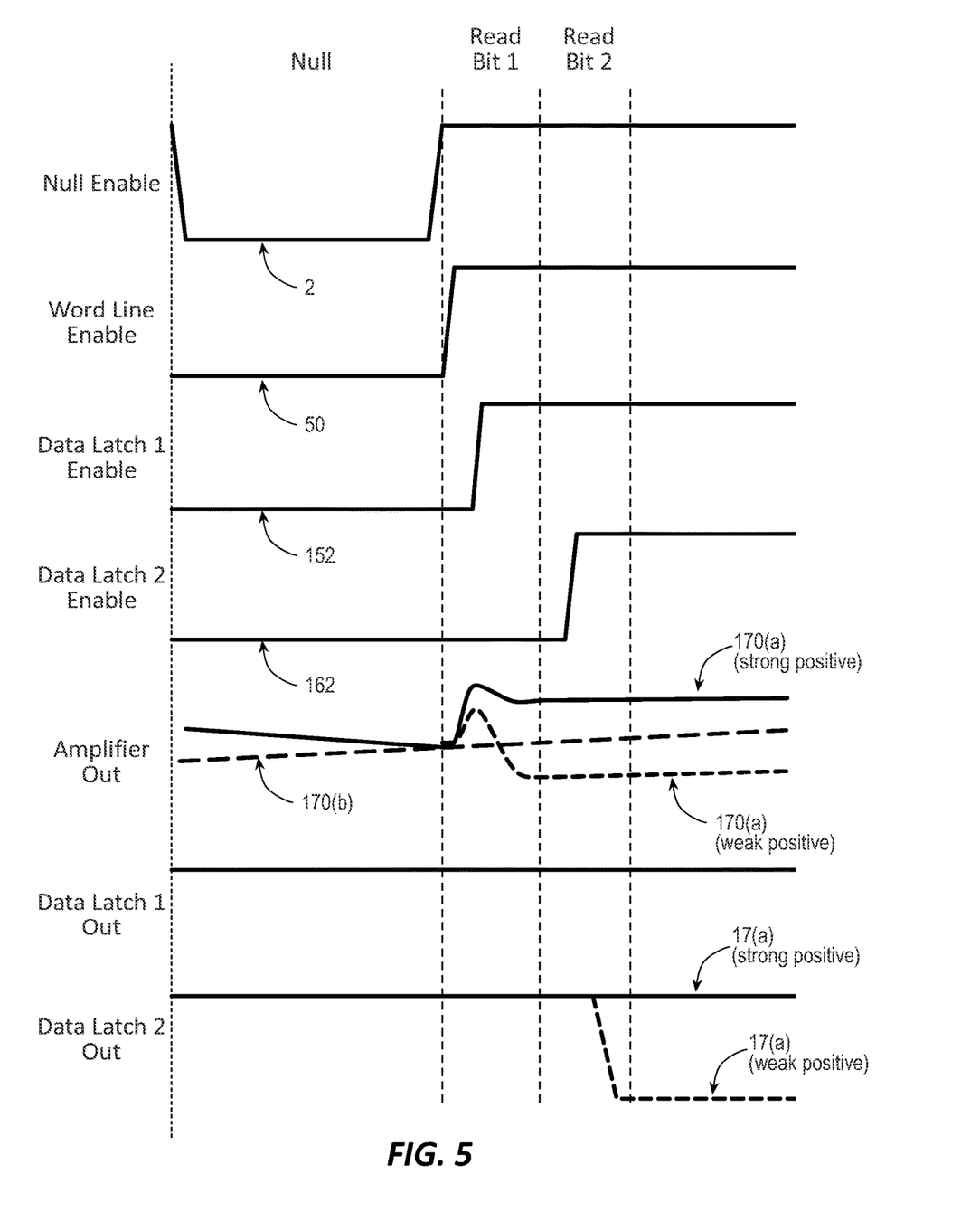
FIG. 5 is a timing diagram showing sensing of 1 and (1,0) data states based on simulations for the preferred embodiment.

FIG. 4 shows typical timing diagrams for reading (0,0) and (0,1) data states of memory cell 10 and FIG. 5 shows timing diagrams for reading (1,1) and (1,0) data states of memory cell 10. Amplifier 80 output voltage curves on nodes 170(a) and 170(b) are based on circuit simulations of the circuits shown in FIG. 2 over the temperature range from OC to 70C, Null Enable, Word Line Enable, Data Latch 1 Enable and Data Latch 2 Enable are signals on nodes 2, 50, 152 and 162, respectively, in FIG. 1. Precharging any relevant internal floating nodes in the circuitry and precharging bit lines prior to commencing the nulling portion of the read cycle are not shown in FIGS. 4 and 5 because such precharging steps are well known to one skilled in the art.

For the simulations, the four voltages corresponding to the four data states stored on memory cell capacitor C5 in memory cell 10 are 1.1V, 0.6V, 0.3V and V. The correspondence with the data bits stored in the memory cell is (1,1), (1,0), (0,1) and (0,0), respectively. Because data retention effects may have a greater influence on the read margins for the more positive voltages stored on the memory cell capacitors and because the voltage across the sense amplifier decreases for reading the more positive voltages stored on the memory cell capacitors, it may be preferable to have the voltage spacing between the more positive states larger than those for the more negative states.

For FIGS. 4 and 5, the bit line precharge voltage is 0.35V. During the nulling portion of the read cycle, bit lines 20 and 25 charge approximately an additional 50 mV so at the conclusion of the nulling portion of the read cycle bit lines 20 and 25 are at approximately 400 mV. Temperature has only a small effect on charging bit lines 20 and 25 during the read cycle. Vdd is 1.5V and Va is 1.85V. The bit line capacitance to cell capacitor ratio is 40:1 with 1 pF for bit fine capacitance C2, 1 pF for reference bit line capacitance C1, and 25 pF for cell capacitor C5.

For the simulations, the inherent output offset voltage of the amplifier $0 is set to approximately 200 mV by unbalancing transistors in amplifier 80. Should the offset voltage variation on an actual chip for a given manufacturing process be less than this amount, the duration of the nulling portion of the read cycle can be shortened.

The waveforms on output nodes 170(a) and 170(b) of amplifier 80 are representative of the simulations. The voltages on bit line 20 and reference bit line 25 differ by only a few to several millivolts so they are not shown in FIGS. 4 and 5. The differential read margins between outputs 170(a) and 170(b) of amplifier 80 for the four data states stored in the memory cell exceed 120 mV for each case. Therefore, inherent offsets of data latches 150 and 160 are not an issue because they are typically smaller than this.

It can be seen in FIGS. 4 and 5 that the outputs of data latches 150 and 160 go to the proper states for reading the bits corresponding to each of the four data states stored in memory cell 10. For example, in FIG. 5 for a strong positive voltage, the output of data latch 150 is high corresponding to the first bit being a one and the output of data latch 160 is also high corresponding to the second bit being a one. In contrast, for a weak positive voltage, the output of data latch 150 is high corresponding to the first bit being a one but the output of data latch 160 is low corresponding to the second bit being a zero.

Read cycle speed is a significant consideration particularly when a new DRAM chip architecture, such as storing two bits per memory cell, is intended for use on circuit boards where the clock speed is already set. Read speed for today's DRAM technologies may be of the order of 13 nanoseconds from bit line precharging until data are available in data latches. Simulations indicate that data latches 150 and 160 take up to 2 ns each to read the first and second bits stored in memory cell 10. The nulling operation can take up to 6 ns depending on the inherent offset of the sense amplifier. This leaves 3 ns or more for the precharge cycle.

In a conventional DRAM the rewrite cycle occurs as data are latched into sense amplifiers. However, for the preferred embodiment of this invention the bits identified from the data states stored in memory cell 10 are first stored in data latches 150 and 160 and then subsequently rewritten into memory cell 10 using the data stored in data latches 150 and 160 and rewrite apparatus 90. The rewrite cycle must be completed before other bits are accessed in memory array segments 100 and 200.

Power consumption is a significant consideration for many DRAMs used in portable applications as well as in other applications. When storing two bits per memory cell, if the read power for a given number of memory cells remains the same, the power consumed per bit is one half that compared to storing one bit per memory cell. Therefore, reasonable increases in read cycle power to read two bits per memory cell may be acceptable.

It can be appreciated by one skilled in the art that there are alternate embodiments of this invention that reflect the spirit of this invention. These include variations in the type of amplifier that can be used and variations in the reference scheme to read more than one bit per memory cell. For example, introducing an amplifier offset and changing the voltage on a reference bit line in combination might be used to read a data state stored in a memory cell, Introducing an offset into an amplifier might also be used to sense the data state or first bit stored in a memory cell.

While the preferred embodiment relates to DRAMs, the techniques of the current invention may be applied to other memory types. Some of these other memory types may not require a rewrite or refresh cycle if the read operation is nondestructive, meaning that the bits stored in the memory cells are not flipped, destroyed or adversely affected during the read operation. Some of these other memory types might also involve memory cells that provide currents to the bit lines when the memory cells are read. For example, the duration of the current flowing through a memory cell transistor might be set to provide a certain charge on the bit line from the memory.

The specific numbers, dimensions and parameters presented in this invention correspond to certain technology nodes. Over time dimensions as well as voltages scale in semiconductor technologies. Therefore, as this scaling occurs, the specific numbers, dimensions and parameters disclosed in this invention do not limit the scope of this invention as it applies to other semiconductor technologies at more aggressive or less aggressive technology nodes.

What is claimed is:

1. A method for reading a first bit value and a second bit value from a memory cell, the method comprising:
   precharging a bit line and a reference bit line to predetermined voltages, wherein the bit line and the reference bit line are electrically coupled to an amplifier;
   introducing a first offset voltage in the amplifier during read cycle, wherein the first offset voltage is configured to reduce an inherent output offset voltage of the amplifier;
   using the amplifier to sense the first bit value based upon a voltage of the memory cell;
   latching the first bit value in a first data latch, wherein the first data latch is configured to output an offset control voltage in response to the first bit value being latched into the first data latch;
   directing the offset control voltage of the first data latch to the amplifier to introduce a second offset voltage in the amplifier;
   using the amplifier to sense the second bit value based upon the voltage of the memory cell;
   latching the second bit value into a second data latch;
   outputting the first bit value and the second bit value.

2. The method of claim 1, wherein the amplifier comprises a differential sensing amplifier.

3. The method of claim 2, wherein said amplifier is a double current mirror amplifier.

4. The method of claim 2, further comprising:
   providing a first memory array segment having said memory cell, and
   providing a second memory array segment where said reference bit line is in a second memory segment.

5. The method of claim 1, further comprising:
   generating signals on inputs of said amplifier to reduce the inherent output offset voltage of said amplifier prior to a sensing operation of the read cycle.

6. The method of claim 1, further comprising:
   rewriting the first bit value and the second bit value into said memory cell after a completion of the read cycle.

7. A method of using memory cell, the method comprising:
   using an amplifier to sense a first value based upon a voltage of the memory cell;
   latching the first value in a first data latch, wherein the first data latch is configured to output an offset control voltage in response to the first value being latched into the first data latch;
   directing the offset control voltage of the first data latch to the amplifier to introduce a second offset voltage in the amplifier;
   using the amplifier to sense the second value based upon the voltage of the memory cell;
   latching the second value into a second data latch;
   outputting the first value and the second value.

8. A device, comprising:
   a memory cell;
   a sense amplifier electrically coupled to the memory cell, wherein the sense amplifier is configured to generate an output voltage based upon a comparison of a voltage of the memory cell to a reference voltage;
   an offset control circuit electrically coupled to the sense amplifier, wherein the offset control circuit is configured to set a voltage offset of the sense amplifier;
   a first data latch electrically coupled to the sense amplifier, wherein the first data latch is configured to store a first bit value and, when the first data latch stores the first bit value, output an offset control signal to the sense amplifier;
   a second data latch electrically coupled to sense amplifier, wherein the second data latch is configured to store a second bit value; and
   a control circuit configured to:
      introduce a first offset voltage in the sense amplifier,
      use the amplifier to sense the first bit value based upon the voltage of the memory cell;
      latch the first bit value into the first data latch to cause the first data latch to output the offset control signal to the sense amplifier to introduce a second offset voltage in the amplifier;
      use the amplifier to sense the second bit value based upon the voltage of the memory cell; and
      latch the second bit value into the second data latch.

9. The device of claim 8, wherein the sense amplifier includes a differential sensing amplifier.

10. The device of claim 8, wherein the sense amplifier is a double current mirror amplifier.

11. The device of claim 8, further comprising:
    a first memory array segment including the memory cell; and a second memory array segment including a reference memory cell having the reference voltage.

12. The device of claim 8, wherein the control circuit is configured to generate signals on inputs of the sense amplifier to reduce an inherent output offset voltage of the sense amplifier prior to executing a sensing portion of a read cycle.

13. The device of claim 12, wherein the control circuit is configured to rewrite the first bit value and the second bit value into the memory cell after a completion of the read cycle.

* * * * *